United States Patent [19]
Shannon

[11] Patent Number: 5,412,595
[45] Date of Patent: May 2, 1995

US005412595A

[54] OPTO-ELECTRONIC MEMORY SYSTEM

[75] Inventor: John M. Shannon, Whyteleafe, England

[73] Assignee: U.S. Philips Corporation, New York, N.Y.

[21] Appl. No.: 277,447

[22] Filed: Jul. 19, 1994

[30] Foreign Application Priority Data

Jul. 21, 1993 [GB] United Kingdom ............... 9315125

[51] Int. Cl.⁶ ................... G11C 13/04; G11C 11/42
[52] U.S. Cl. ............................. 365/108; 365/110; 365/112; 365/64; 235/454; 235/491
[58] Field of Search ............... 365/108, 109, 110, 111, 365/112, 64; 359/54, 55; 235/491, 454, 456; 358/213.11, 213.13

[56] References Cited

U.S. PATENT DOCUMENTS

| | | | |
|---|---|---|---|
| 4,644,406 | 2/1987 | Nishigaki et al. | 358/213 |
| 4,691,243 | 9/1987 | Cannella et al. | 358/294 |
| 5,262,980 | 11/1993 | Shannon | 365/108 |

FOREIGN PATENT DOCUMENTS 0509597 10/1992 European Pat. Off. .

*Primary Examiner*—Joseph A. Popek
*Assistant Examiner*—Tan Nguyen
*Attorney, Agent, or Firm*—David R. Treacy

[57] ABSTRACT

An opto-electronic memory system comprises a memory element (14) in which information is stored in an array of optically readable memory locations (17) and reading means comprising an electro-optic, e.g. liquid crystal, shutter arrangement (10) which is operable to scan the memory element with reading light and an array of linear light sensitive elements (18) disposed adjacent the output side of the shutter arrangement and extending in the scan direction, the light sensitive element array defining a reading surface remote from the shutter arrangement (10) on which the memory element (14) is disposed with the memory locations (17) in close proximity to the light sensitive elements (18) and being operable in a contact sensing mode to sense reading light reflected from the memory locations of the memory element according to the reflectance characteristics of the memory locations.

12 Claims, 2 Drawing Sheets

OPTO-ELECTRONIC MEMORY SYSTEM

BACKGROUND OF THE INVENTION

This invention relates to an opto-electronic memory system comprising a planar memory element in which information is stored in a two dimensional array of optically readable memory locations and reading means for optically reading information in the memory element and providing an electrical output in accordance therewith, the reading means comprising an electro-optic shutter arrangement which is operable to address memory locations of the memory element with reading light and to scan the array with said reading light along a first direction of the array, and a light sensing arrangement comprising a planar array of linear light sensitive elements disposed adjacent to the memory element with the linear light sensitive elements extending parallel to one another in said first direction for sensing light from the memory element.

Such a system is described in EP-A-0509597. In this system, the electro-optic shutter arrangement consists of a planar array of linear liquid crystal light shutters arranged parallel to one another and extending in a second direction perpendicular to the first direction, together with a light source which illuminates the array over its input side. The memory element, in the form, for example, of a digital data card, carries optically encoded data and consists of a medium, such as a photographic medium, having memory locations arranged in rows and columns whose light transmission characteristics denote stored information. To read the stored information the memory element is disposed in a gap between the array of electro-optic shutters and the array of light sensitive elements, which consists of thin film photodiodes in strip form carried on a support. The liquid crystal light shutters are operated individually in sequence so as in effect to scan in step fashion a band of light determined by the size of a light shutter and covering the height of a column of memory locations in the memory element across the array in the row direction. The system may also be operated in a random access mode wherein the light shutters are operated to scan the memory element in a non-sequential manner. The system can be used for reading stored digital data in applications similar to CD-ROM systems, audio CD systems and so-called laser card systems. In these systems information consisting of digital data stored in an optically-readable manner on a carrier such as a disc or card is read out by electromechanically scanning a light beam over the carrier and detecting the beam reflected or transmitted in accordance with stored information with the carrier being scanned by moving the carrier relative to the light beam and detector.

Unlike these known systems, the system of EP-A-0509597 uses an entirely solid-state optical scanning approach and requires no moving parts for a read operation. The avoidance of an electro-mechanical scanning arrangement, typically involving motors and optical components such as lenses, offers significant advantages. Most importantly, the reading means can be more compact with the arrays of electro-optic shutters and light sensitive elements occupying an area approximately corresponding to the information storage area of the memory element. In the system of EP-A-0509597 however, it is important for successful operation that the light directed towards the memory element be highly collimated so that the light entering the memory element is substantially parallel and is directed substantially perpendicularly to the plane of the memory element, particularly if a high density of memory locations is used. The light shutter array should ideally be very close to the light sensitive element array. However, because the memory element is disposed between these two components a certain minimum thickness of the gap between the output side of the former and the input side of the latter into which the memory element is inserted is demanded, this minimum thickness being determined by the thickness of the memory element. In relation to the thicknesses of the components of the reading means this can be significant. Highly parallel light directed perpendicularly onto the light shutter array is thus required to avoid problems of cross-talk. Moreover, after a period of time during which memory elements are repeatedly inserted and extracted, dust and other deposits can accumulate in the gap which may affect reading performance. Because the light shutter array and the sensing element array are fixed together forming an assembly, cleaning of the gap between these two components, and particularly their exposed surfaces, is difficult.

SUMMARY OF THE INVENTION

It is an object of the present invention to provide an improved opto-electronic memory system.

It is another object of the present invention to provide an opto-electronic memory system in which the illumination requirements are less stringent.

According to the present invention, there is provided an opto-electronic memory system of the kind described in the opening paragraph which is characterised in that the light sensing arrangement is disposed adjacent to the output side of the electro-optic shutter arrangement and has a surface remote from the electro-optic shutter arrangement over which the memory element is disposed in close proximity to the light sensitive elements thereof, the light sensing arrangement being operable in a contact sensing mode.

The invention has many of the advantages of the system of EP-A-0509597, as described therein, but in addition offers further significant advantages.

As in the system of EP-A-0509597, the electro-optic shutter arrangement may be operated so as to scan the memory locations of the memory element with reading light in a sequential manner, for example with successive columns of memory locations being addressed in turn, or in a non-sequential manner for a random access mode of operation in which individual columns of memory locations for example are read other than in their physical order in the array.

By using a light sensing arrangement which operates in a contact image sensing mode the need to use highly parallel light is avoided. Consequently, the need to use microlenses, collimating films or the like is removed and simpler illuminating means can be employed. Contact sensing relies on the medium containing the information to be read being positioned very close to the sensing elements so that light directed onto the medium from behind the sensing elements is reflected diffusely back towards the sensing elements according to optical density or reflectance of the respective portions of the medium substantially immediately overlying the individual sensing elements. For this purpose it is actually desirable for the illuminating light to be diffuse or divergent to an extent so that it impinges on the medium at an angle other than perpendicular. Such diffuse illumination can be provided more easily than parallel light.

Importantly, the thickness of the memory element need not be limited. It is necessary only for the surface of the memory element which is disposed facing the sensing element array to have the appropriate optical properties. The element can therefore have a thickness selected according to the material used, to provide greater robustness without detrimentally affecting the operation of the reading means.

Sensing element arrays operating as contact image sensors are known, having been developed especially for reading printed documents primarily for use in facsimile and document copier equipment to translate a document image into an electronic form by direct contact reading. Because of the close proximity between the sensing elements of a contact image type sensor and the document, each sensing element senses only light reflected from an area of the document of generally equal size and is thus able to resolve the light without a focussing optical system being necessary.

In these known contact image sensors, the sensing elements are arranged either in a two dimensional, row and column, matrix array of individual elements or simply as a single linear array of individual sensing elements, the latter kind requiring relative displacement to be effected between the array and the document when reading the document. The light sensing arrangement of the present invention, however, like that of EP-A-0509597, comprises an array of parallel linear light sensitive elements. In conjunction with an array of parallel linear electro-optic shutters extending perpendicularly to the set of linear light sensitive elements read-out regions, in a row and column matrix array, are then obtained at the intersections of the sets of shutters and light sensitive elements. Information in memory locations of the memory element at positions corresponding to these read-out regions is read using a solid state scanning approach for example by operating each shutter individually in sequence to allow light to pass therethrough and monitoring the electrical outputs of the set of light sensitive elements. Like the sensing elements of the system described in EP-A-0509597, the linear light sensitive elements of the present invention may each comprise a thin film diode device, for example having a n-i-p structure, although other kinds of photoelectric devices which are capable of producing a detectable electrical characteristic in response to light impinging thereon, for example photoconductive or photoresistive devices, could be used.

The sensing elements of known two dimensional contact image sensors are connected to sets of row and column address typically via respective switching devices, usually either TFTs or diode devices. However, such address conductors and switching devices are unnecessary for the light sensing arrangement of the present invention so that a simplified, and more easily fabricated, structure is possible.

The memory element may comprise any suitable medium in which the optical density or reflectance of localised areas can be selectively determined, either permanently or reversably, as a means for storing information in the form of optically encoded data and rendering the memory element suitable for use with the contact sensing technique. The memory element may be produced for example by printing using a light absorbing, e.g. black, ink or dye on a generally reflective, e.g. white, substrate or using CD technology.

It is to be understood that the term "light" used herein is intended to include non-visible parts of the spectrum such as infra-red.

BRIEF DESCRIPTION OF THE DRAWINGS

An embodiment. of an opto-electronic memory system according to the invention will now be described, by way of example, with reference to the accompanying drawing, in which.

It will, of course, be appreciated that the Figures are merely schematic and are not drawn to scale. In particular certain dimensions, such as the thicknesses of layers, may have been exaggerated whilst other dimensions may have been reduced.

DESCRIPTION OF THE PREFERRED EMBODIMENTS

Figure 1:
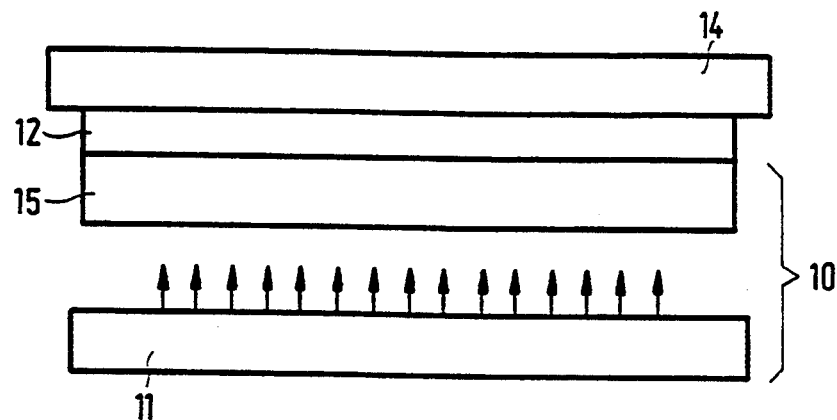
FIGS. 1 and 2 are respectively a schematic side view illustrating the relative disposition of the main components of the memory system in use and a diagrammatic plan view of the memory system.

The electro-optic memory system comprises a planar memory element in which optically readable information is stored in a two dimensional planar array of memory locations, and a reading means for reading information from the memory element. Referring to FIG. 1, the reading means comprises two juxtaposed main parts, namely an electro-optic scanning component 10, to which addressing signals are applied, and a light sensing component 12 from which electrical output signals are obtained indicative of information stored in the optically encoded memory locations of the memory element, referenced at 14.

Features of the system, and its intended uses, are similar to those of the system described in EP-A-0509597 to which reference is invited for further information and whose disclosure is incorporated herein by reference.

Figure 2:
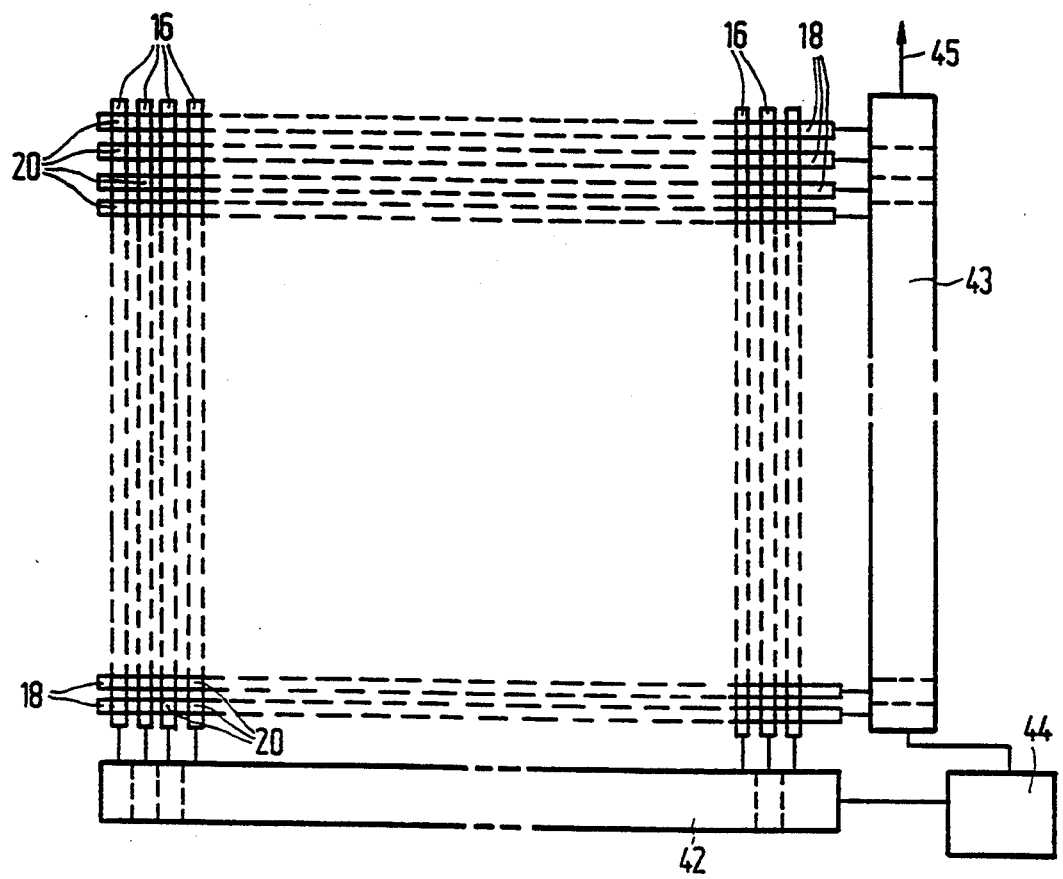

Referring also to FIG. 2, from which the memory element 14 has been omitted for clarity, the scanning component 10 comprises a liquid crystal panel 15 providing a two dimensional array of electro-optic, liquid crystal, shutters 16, defined by respective regions of the panel, which are closely spaced and of elongate strip shape extending parallel to one another in one direction, in this example a column direction. Each shutter is defined by respective control electrodes of strip shape and is selectively operable by the application of suitable voltages to the electrodes in known manner to switch from a light blocking state to a light transmissive state to allow light from a light source 11 positioned adjacent the input side of the scanning component 10 to pass therethrough. The light source 11 comprises a flood source of light which provides generally diffuse and substantially uniform illumination over the entire input side of the scanning component 15. The light source may take various forms, and can be similar to those known in the field of liquid crystal display devices,for example comprising a two dimensional fluorescent light source with reflectors. The electro-optic scanning component is operable by appropriately switching each of the shutters 16 in sequence to scan the facing surface of the memory element in a direction perpendicular to the main axis of the shutter, i.e. the row direction, with an elongate band of light whose length and width correspond approximately with the dimensions of the shutters 16.

The light sensing component 12 is disposed immediately over the output surface of the light shutter panel 12 and comprises a contact image sensing type device having a planar array of photo-electric light sensitive elements 18 which are of elongate strip shape and arranged closely spaced and parallel to one another. The light sensitive elements 18 comprise thin film elongated photodiode devices formed as n-i-p structures using amorphous silicon material. The linear elements 18 extend in a second direction at right angles to the main direction of the shutters 16, i.e. in a row direction, corresponding to the scanning direction. The sets of shutters 16 and light sensitive elements 18 thus cross-over one another and define at their intersections respective read-out regions, for example as indicated at 20, whose size is determined by the dimensions of the overlapping portions of the respective shutters 16 and elements 18.

The components 10 and 12 are mounted together in a permanent manner using any suitable means (not shown).

The memory element 14 comprises an information storage medium having a row and column array of memory locations whose pitch corresponds to the pitch of the read-out regions 20. Information is stored in the memory locations of the memory element as data bits in binary form in a manner suited for optical reading using a contact image type sensor. Each memory location has one of two distinguishable optical density or reflectance states. The memory locations can be provided in a variety of forms using any suitable medium in which the reflectance characteristic of localised areas, in response to the reading light directed thereon, can be selectively determined either permanently or reversibly as a means to store data in a manner compatible with the contact sensing approach. For example, the memory element may comprise a substrate of card or plastics which is generally light reflective and at whose surface region selected memory locations are rendered substantially non-reflective by means of dye or ink. The required pattern of reflective and non-reflective memory locations can be obtained by any convenient technique such as printing. Alternatively a photographic medium could be used.

Figure 3:
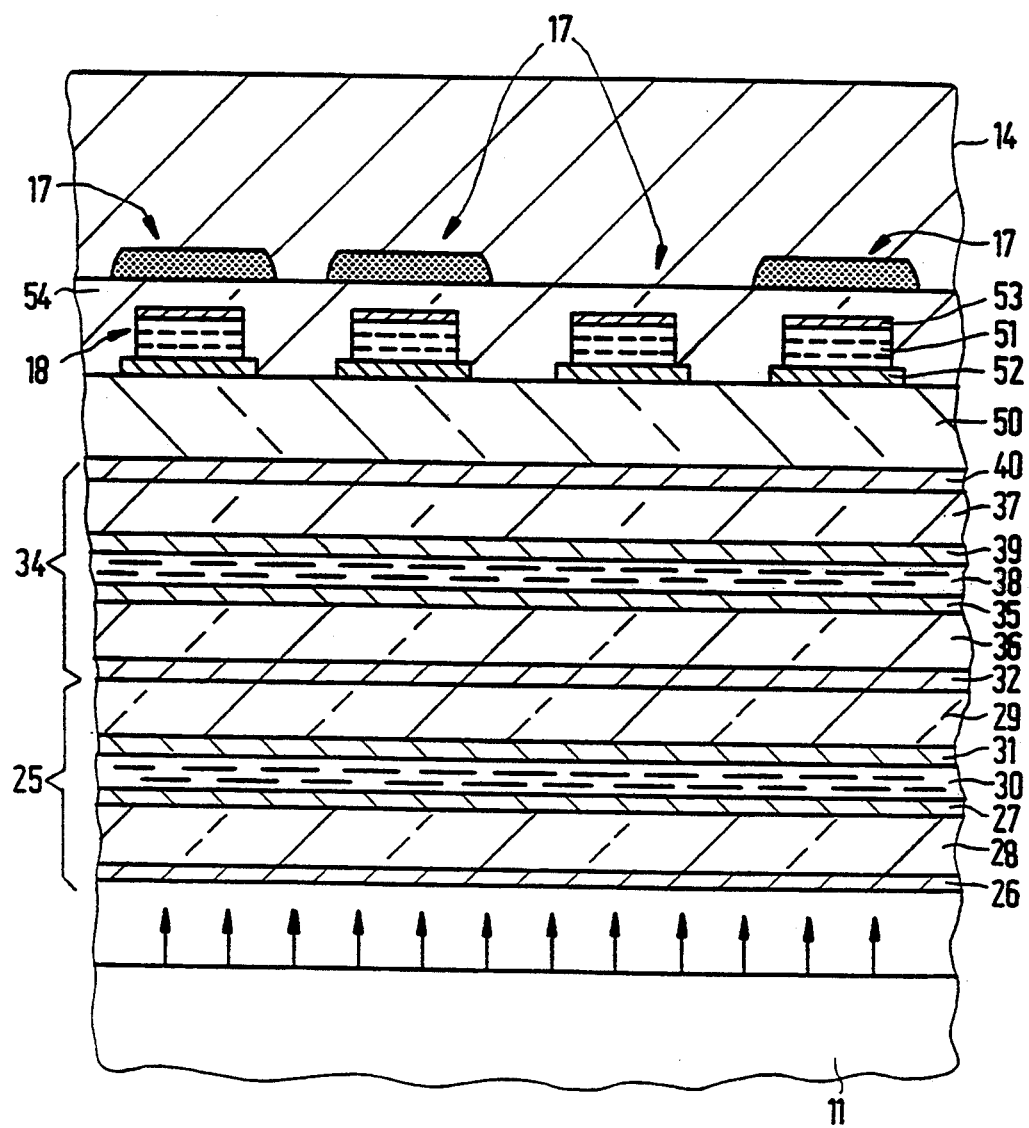
FIG. 3 is an enlarged schematic cross-sectional view through a part of the memory system.

FIG. 3 shows a cross-section schematic view, not to scale, through a typical part of the structure of the reading means and with a memory element in situ. The scanning liquid crystal panel 15 in this example is similar to that described in EP-A-0509597 and consists of two liquid crystal cells arranged overlying one another and optically in series giving high on/off contrast ratio from the shutters with good transmission characteristics in their on (open) states, and substantially complete blocking of light in their off (closed) states. The two cells in series also have a collimating effect so that light exiting from a shutter is less divergent than the incoming light. Each of the cells, referenced at 25 and 34 respectively, comprises a pair of spaced glass plates 28, 29 and 36, 37 with twisted nematic liquid crystal material 30, 38 sealed therebetween. The plates 28, 29 and 37 each carry on their outer surface a polariser, 26, 32 and 40 respectively. The plates 28 and 37 carry on their inner surface a continuous ITO electrode layer 27 and 39 respectively, common to all shutters. The plates 29 and 30 carry on their inner surface facing the liquid crystal material aligned sets of spaced, strip shape, ITO electrodes 31 and 35 (only one of each of which is visible) defining respective shutters. Each pair of aligned electrodes 31 and 35 define co-extensive regions of the two liquid crystal cells which together constitute a respective liquid crystal shutter. Regions of the glass supports 29 and 36 intermediate the strip electrodes 31 and 35 carried thereon are covered with a black, light absorbing, matrix, not visible in FIG. 3 so that the light shutter regions are clearly separated.

The set of light sensitive elements 18 of the light sensing component 12 are carried on one surface of a planar glass supporting substrate 50 whose other surface is mounted directly on the output side of the scanning component 10. Each element 18 comprises an elongate layer of amorphous silicon semiconductor material 51 having an n-i-p structure. The semiconductor layer overlies and contacts with a strip electrode 52 of light opaque metal which is slightly wider than the semiconductor layer and serves also to shield the semiconductor layer 51 from light directly from the light scanning component 10. A transparent electrode 53 of ITO is provided on the opposing surface of the layer 51 of each element. The structure on the substrate 50 is fabricated using conventional thin film technology by depositing and patterning thin film layers. The contact imaging type light sensing component 12 is completed by depositing over this structure a planarising layer 54 of insulating, light transparent, and abrasion resistant material such as amorphous silicon carbide or silicon nitride which also acts as a passivation layer for the photodiode elements. This layer defines a planar reading surface remote from, and parallel with, the surface of the substrate 50, on which the memory element 14 is directly placed and supported when performing a reading operation. A polyimide layer may be used, either by itself or disposed over the aforementioned layer. The thickness of the layer 54, or combination of layers, at the regions where it overlies the photodiode elements 18 is minimised so that, when placed on the reading surface, the memory locations here referenced 17, at the facing surface of the memory element are in close proximity with the elements 18. Proximity focussing of light from the reflective memory locations onto their associated elements 18 is thus ensured. The memory element is placed upon the light sensing component 1g with its position relative thereto being determined by guides (not shown) so that its memory locations are appropriately in registration with respective read-out regions.

The contact image type light sensing component 12 is similar in respects to known contact image sensor arrays, both linear and two dimensional which have been proposed for use in reading documents in facsimile and document copying equipment and hence the aforegoing description has been kept brief. For further general information, and description of their principle of operation, reference is invited for examples to U.S. Pat. No. 4,691,243 and U.S. Pat. No. 4,644,406 whose disclosures regarding contact image sensing devices is incorporated herein by reference. It is to be noted, however, that the light sensing component 12 is considerably simpler in its structure than those of known two dimensional sensor devices which use a row and column array of individual photosensitive elements together with associated sets of row and column address conductors. Moreover, such known contact image sensing devices typically include an isolation, switching, device, for example a diode or TFT, in each individual photosensitive element in the array. These isolation devices are not needed for the component 10.

Each of the light shutters is individually energisable by the application of appropriate potentials to its electrodes to switch from an off, opaque state, to an on, light transmissive state. To this end, each aligned pair of strip electrodes 31 and 35 constituting a respective shutter 16 is connected to a respective output stage of a scan drive circuit 42 (FIG. 2) of the shift register type which is operable to apply the required voltages. In similar manner, an electrode terminal of each of the light sensitive elements 18 is connected to a respective stage of an output register circuit 43. The electrodes 27 and 39 of the shutters and the other terminals of the elements 18 are connected to predetermined potentials. The circuits 42 and 43 are connected to a timing and control circuit 44 through which their operations are controlled and synchronised.

The shutters 16 are normally held in their off state to block light. In order to read the memory element, the element is placed on the light sensing component 12 in substantial contact with its reading surface. Although not shown in the figures, the reading means preferably also includes a cover which during operation overlies the memory element and holds the element firmly against the reading surface of the layer 54. This cover may take the form of a pivotally-mounted lid. The circuit 42 is then operated to switch individually in turn each shutter 16 of the array to its transmissive state thereby to scan the memory element in the row direction with a narrow strip of light, in step fashion from one side to the other. At the memory element 14, the diffuse reflection or scattering of this reading light back towards the light sensitive elements 18 is determined locally by the optical reflectance states of the individual memory locations 17 immediately overlying respective portions of the elements 18. Examples of the reflective and absorptive states of the memory locations 17 are indicated in FIG. 3 by clear and shaded areas respectively of the element 14. Thus, when a particular shutter 16 is opened, a strip of light is directed onto the corresponding column of memory locations and a quantity of light will either be reflected onto the light sensitive elements 18 or not depending on whether the memory locations 17 at the respective read-out regions g0 reflect or absorb the incident light, either causing an electrical signal to be supplied to the associated stage of the output register circuit 43 or not as the case may be. In this way the bits of information stored in a column of memory locations in the memory element 14 are accessed and read out simultaneously to their respective stages of the output register circuit. The contents of the register stages are then fed to an output 45 in serial fashion. As each shutter is energised in turn, the information in each column of memory locations is read out separately to the register circuit 43, and a serial output obtained at 45, in succession. The information stored in memory location columns of the memory element is thus read out a column at a time in sequence by scanning the shutters 16 one after the other. Considering, for simplicity, a memory element having a memory location array of around 6 cms square and assuming the shutters 16 and light sensitive elements 18 each are 6 cms in length and 5 micrometres in width and adjacent pairs of shutters 16 and elements 18 are spaced apart by 2 micrometres then around 6000 shutters and 6000 light sensitive elements can be accommodated giving $36 \times 10^6$ read-out regions. Thus, a memory element of these dimensions is readily capable of holding 36 megabits of information. Higher data storage capacities are possible by increasing the density of the memory locations, and the number of photosensitive elements accordingly. This is made possible because of the contact sensing approach adopted in which the memory locations are in close proximity to the photosensitive element array. The memory location density can be increased still further by using a light source which produces more parallel light.

The shutters 16 need not be operated sequentially so as to read out each column of memory locations in turn in their physical order. Instead, the memory system can be operated in a random access mode in which the shutters 16 are operated one at a time non-sequentially rather than sequentially so as to scan and read out columns of memory locations other than in their physical sequence. By using a suitably modified drive circuit 42, individual shutters 16 can be operated selectively to enable information stored in particular columns of memory locations to be accessed in any desired order.

It will be appreciated that in the foregoing description reference to columns and rows can be interchanged, the particular terms used in this description merely indicating directions depicted in the Figures.

Various modifications are possible to the above-described embodiment. For example, other forms of construction of light sensing arrangement known in the field of document contact image sensing may be used as will be apparent to persons skilled in the art. Alternative photodiodes structures can be used for the light sensitive elements. Light sensitive devices other than photodiodes, for example photoresistors or photoconductors, photoelectric and photovoltaic devices fabricated as thin film structures on a supporting substrate and which are capable of providing a detectable electrical characteristic in response to a predetermined light input can also be used.

The liquid crystal shutters 16 may be of a form known in the art different to the particular example described with reference to FIG. 3.

It is envisaged also that forms of electro-optic shutters other than liquid crystal shutters could be used in the scanner element.

From reading the present disclosure, other modifications will be apparent to persons skilled in the art. Such modifications may involve other features which are already known in the fields of electro-optic shutters, thin film light sensitive devices and optical memory elements and which may be used instead of or in addition to features already described herein.

I claim:

1. An opto-electronic memory system comprising a planar memory element in which information is stored in a two dimensional array of optically readable memory locations and reading means for optically reading information in the memory element and providing an electrical output in accordance therewith, the reading means comprising an electro-optic shutter arrangement which is operable to address memory locations of the memory element with reading light and to scan the array with said reading light along in a first direction of the array, and a light sensing arrangement comprising a planar array of linear light sensitive elements disposed adjacent to the memory element with the linear light sensitive elements extending parallel to one another in said first direction for sensing light from the memory element, characterised in that the light sensing arrangement is disposed adjacent to the output side of the electro-optic shutter arrangement and has a surface remote from the electro-optic shutter arrangement over which the memory element is disposed in close proximity to the light sensitive elements thereof, the light sensing arrangement being operable in a contact sensing mode.

2. An opto-electronic memory system according to claim 1, characterised in that the electro-optic shutter arrangement comprises an array of linear liquid crystal shutters which extend parallel to one another and in a second direction perpendicular to said first direction.

3. An opto-electronic memory system according to claim 2, characterised in that each liquid crystal shutter comprises two liquid crystal cells arranged optically in series.

4. An opto-electronic memory system according to claim 3, characterized in that the electro-optic shutter arrangement further comprises a fluorescent light source extending adjacent to the array of liquid crystal shutters.

5. An opto-electronic memory system according to claim 2, characterised in that the electro-optic shutter arrangement further comprises a fluorescent light source extending adjacent to the array of liquid crystal shutters.

6. An opto-electronic memory system according to claim 2, characterized in that the light sensitive elements each comprise an elongate thin film photodiode structure which are carried on a common transparent support that is disposed immediately adjacent the electro-optic shutter arrangement and through which the reading light from the electro-optic shutter arrangement passes to the memory element.

7. An opto-electronic memory system according to claim 2, characterised in that the memory element comprises a medium in which the optical reflectance of localized areas is selected to represent stored information.

8. An opto-electronic memory system according to claim 1, characterised in that the light sensitive elements each comprise an elongate thin film photodiode structure which are carried on a common transparent support that is disposed immediately adjacent the electro-optic shutter arrangement and through which the reading light from the electro-optic shutter arrangement passes to the memory element.

9. An opto-electronic memory system according to claim 8, characterised in that the light sensitive element array includes a transparent, insulating layer which covers the light sensitive elements and defines a reading surface on which the memory element is disposed.

10. An opto-electronic memory system according to claim 8, characterized in that the memory element comprises a medium in which the optical reflectance of localized areas is selected to represent stored information.

11. An opto-electronic memory system according to claim 1, characterised in that the memory element comprises a medium in which the optical reflectance of localised areas is selected to represent stored information.

12. An opto-electronic memory system according to claim 11, characterised in that the optical reflectance at localised areas of the memory element is selectively determined by printing with a material having a different optical reflectance to that of the medium.

* * * * *